United States Patent [19]

Suzuki

[11] Patent Number: 4,617,529
[45] Date of Patent: Oct. 14, 1986

[54] RING OSCILLATOR WITH DELAY ELEMENT AND POTENTIAL PULLING CIRCUIT

[75] Inventor: Atsushi Suzuki, Yokohama, Japan

[73] Assignee: Fujitsu Limited, Kawasaki, Japan

[21] Appl. No.: 766,308

[22] Filed: Aug. 16, 1985

[30] Foreign Application Priority Data

Aug. 23, 1984 [JP] Japan ................................ 59-175390

[51] Int. Cl.[4] ........................... H03B 5/00; H03L 1/02
[52] U.S. Cl. ..................................... 331/57; 331/176
[58] Field of Search .................. 331/57, 111, 143, 176

[56] References Cited

U.S. PATENT DOCUMENTS 4,072,910 2/1978 Dingwall et al. ..................... 331/57
4,336,466 6/1982 Sud et al. ......................... 331/57 X Primary Examiner—Eugene R. LaRoche
Assistant Examiner—D. C. Mis
Attorney, Agent, or Firm—Armstrong, Nikaido, Marmelstein & Kubovcik

[57] ABSTRACT

An oscillator circuit including an odd number of inverters connected in cascade to form a loop; a delay element inserted between adjacent inverters; and a pulling circuit. The pulling circuit pulls up and/or pulls down the potential of the output terminal of the delay element during a predetermined period in response to the inversion operation of one of the inverters.

8 Claims, 7 Drawing Figures

RING OSCILLATOR WITH DELAY ELEMENT AND POTENTIAL PULLING CIRCUIT

BACKGROUND OF THE INVENTION

1. Field of the Invention

The present invention relates to an oscillator circuit using an inverter loop with a delay element. The oscillator circuit of the present invention can be used, for example, as one of the elements of a substrate bias voltage generator provided in a semiconductor memory device.

2. Description of the Related Art

Generally known as an oscillator including an odd number of inverters cascade-connected in a loop and a delay circuit consisting of a capacitor and resistor inserted between adjacent inverters. In this oscillator, charging and discharging of the capacitor in the delay circuit cannot be fully effected. Therefore, the oscillating frequency of the oscillator cannot be made lower than a certain value unless a large value capacitor is used. Furthermore, the oscillating frequency of the oscillator is not stable vis-a-vis ambient temperature.

SUMMARY OF THE INVENTION

It is an object of the present invention to provide an oscillator circuit which has an oscillating frequency which can be sufficiently lowered and which is stable vis-a-vis the ambient temperature.

According to a fundamental aspect of the present invention, there is provided an oscillator circuit including an odd number of inverters connected in cascade to form a loop; a delay element inserted between adjacent inverters; and a pulling circuit for pulling up the potential of the output terminal of the delay element during a predetermined period after the potential of the output terminal becomes higher than the threshold voltage of the inverter connected to the delay element and/or for pulling down the potential of the output terminal during a predetermined period after the potential of the output terminal becomes lower than the threshold voltage.

According to another aspect of the present invention, there is provided an oscillator circuit including an odd number of the inverters connected in cascade to form a loop; a delay element inserted between adjacent inverters in the loop; and a circuit for pulling up and pulling down the potential of the output terminal of the delay element alternately in response to an inversion operation of one of the inverters.

BRIEF DESCRIPTION OF THE DRAWINGS

Examples of an oscillator circuit in accordance with the present invention will now be described with reference to the accompanying drawings, in which.

DESCRIPTION OF THE PREFERRED EMBODIMENTS

For a better understanding of the preferred embodiments, the problems in the prior art will first be explained with reference to FIG. 1 and FIG. 2.

Figure 1:
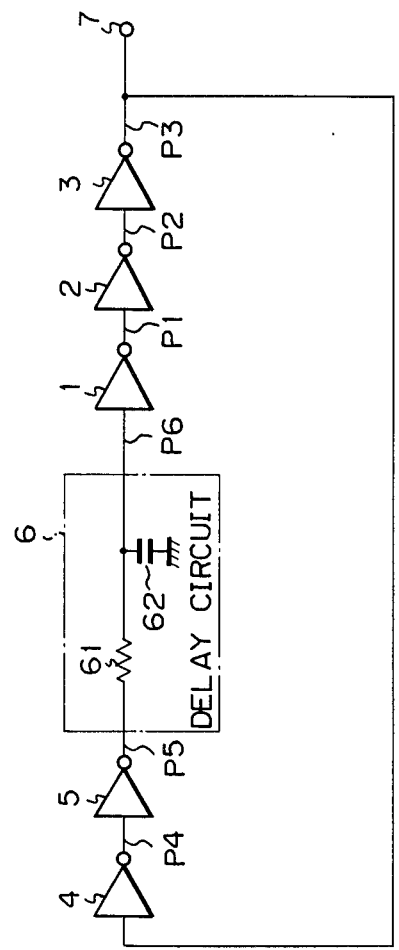
FIG. 1 is a schematic circuit diagram of an oscillator circuit in the prior art.

FIG. 1 shows an oscillator circuit of the prior art. In FIG. 1, 1 through 5 are complementary metaloxide semiconductor (CMOS) type inverters, 6 a delay circuit, and 7 an output terminal of the oscillator circuit. The inverters 1 through 5 are connected in cascade to form a loop. The delay circuit 6 is an integration circuit consisting of a resistance element 61 and a capacitance element 62 and is inserted between the inverters 5 and 1.

The mode of operation of the oscillator circuit of FIG. 1 will now be described with reference to FIG. 2.

Figure 2:
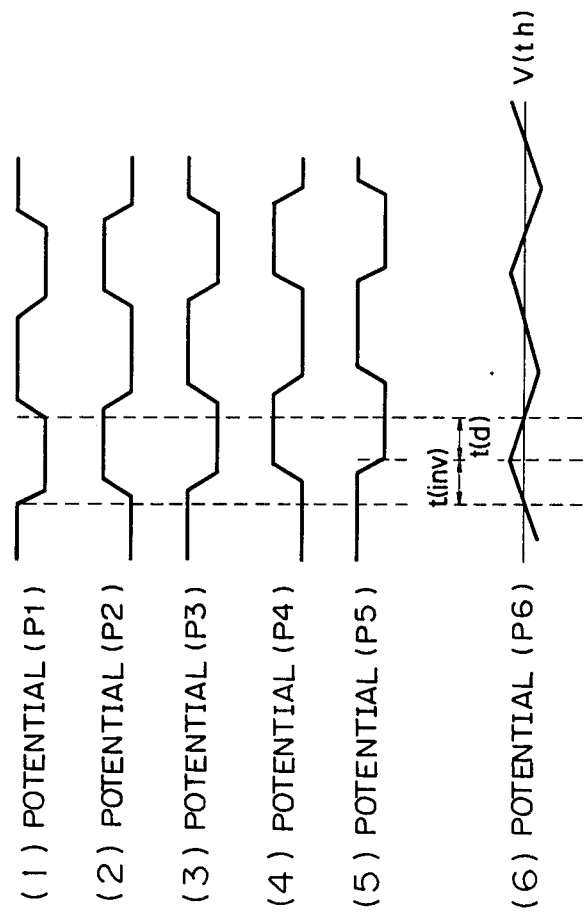
FIG. 2 is a waveform chart showing waveforms corresponding to points in FIG. 1.

In FIG. 2, (1) through (6) show voltage waveforms at points P1 through P6 in FIG. 1, respectively. Now, assuming that the voltage of the output terminal of the inverter 5 (i.e., the point P5) is "High" level, the capacitance element 62 in the delay circuit 6 is charged through the resistance element 61, and the output voltage of the delay circuit 6 increases gradually.

When the output voltage of the delay circuit 6 becomes higher than the threshold voltage $V_{(th)}$ of the inverter 1 (i.e., the voltage level for deciding the output level of the inverter 1 to be "H" or "L"), the output voltage of the inverter 1 changes from "High" to "Low" and the inverters 2 through 5 are inverted in sequence with a certain delay time. As a result, the output voltage of the inverter 5 changes from "H" to "L", whereby the capacitance element 62 begins to discharge, i.e., the output voltage of the delay circuit 6 begins to decrease gradually.

When the output voltage of the delay circuit 6 becomes lower than the threshold voltage $V_{(th)}$, the output voltage of the inverter 1 changes from "L" to "H", and the inverters 2 through 5 are inverted in sequence as described above. Therefore, the output voltage of the delay circuit 6 begins to increase gradually. The same operations are continued thereafter, whereby oscillation occurs.

In the oscillator circuit of FIG. 1, the delay time $t_{(inv)}$ of the inversion (referred to as the inversion time $t_{(inv)}$ hereafter) necessary to invert the inverters 1 through 5 is very small. Therefore, when the output voltage of the delay circuit 6 becomes higher than the threshold voltage $V_{(th)}$ so that inversion of the inverter 1 occurs, this inversion is immediately transmitted from the inverter 1 through the inverter 5. Accordingly, the input voltage of the delay circuit 6 changes from "H" to "L" immediately after the inversion of the inverter 1. As a result, since the charging time of the capacitance element 62 is very short, the output voltage of the delay circuit 6 begins to decrease before it reaches up to the supply voltage $V_{(SS)}$.

After a lapse of a certain delay time $t_{(d)}$, the output voltage of the delay circuit 6 becomes lower than the threshold voltage $V_{(th)}$, which causes inversion of the inverters 1 through 5. Therefore the input voltage of the delay circuit 6 changes from "L" to "H", whereby the output voltage of the delay circuit 6 begins to increase. In this case, the output voltage of the delay circuit 6 cannot reach down to the supply voltage $V_{(DD)}$ (or ground voltage) since the discharging time is very short.

Consequently, the output voltage of the delay circuit 6 only changes slightly up and down around the threshold voltage $V_{(th)}$. As a result, the capacitance element 62 cannot fully charge or discharge, therefore the delay time $t_{(d)}$ of the delay circuit 6 cannot be made long. This prevents obtaining a low oscillating frequency except when using a large capacitance of the capacitance element 62. Use of a large capacitance of the capacitance element 62 is undesirable when manufacturing the oscillator circuit by an integrated circuit.

Furthermore, as is clear from FIG. 2, the inversion time $t_{(inv)}$ of the inverters 1 through 5 and the delay time $t_{(d)}$ of the delay circuit 6 determine the oscillating frequency of the oscillator circuit of FIG. 1. The inversion time $t_{(inv)}$ changes in accordance with the ambient temperature. Further, the delay time $t_{(d)}$ of the delay circuit 6 changes in accordance with the delay time $t_{(inv)}$. Consequently, the oscillating frequency of the oscillator circuit of FIG. 1 is not stable against ambient temperature.

Figure 3:
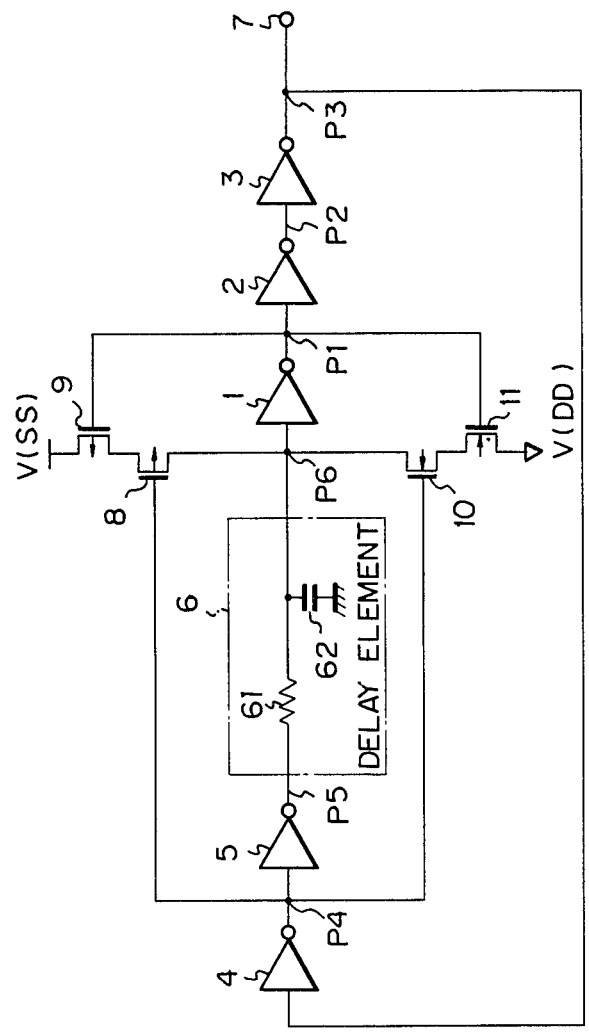
FIG. 3 is a schematic circuit diagram of one embodiment of an oscillator circuit according to the present invention
Figure 4:
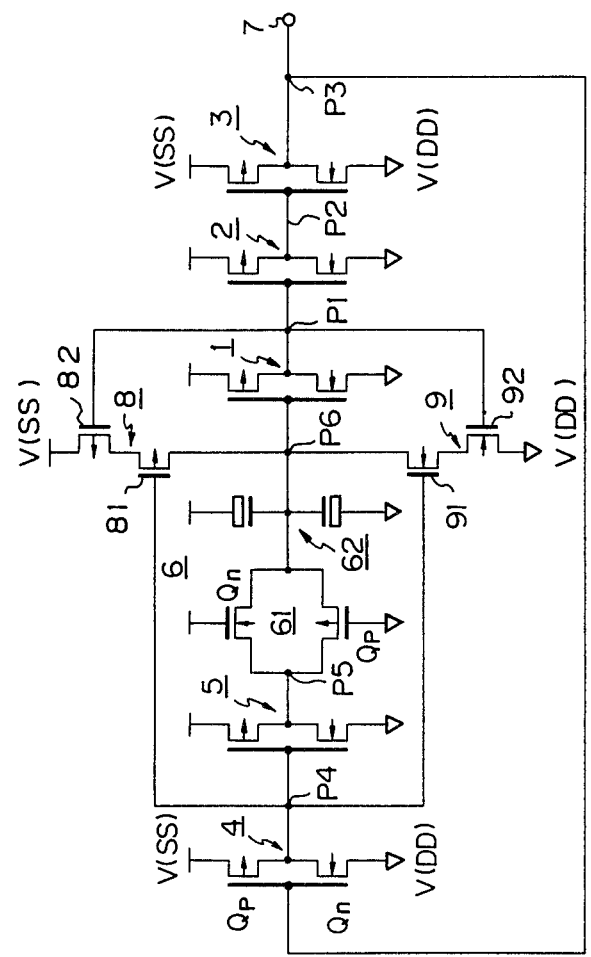
FIG. 4 is a more detailed circuit diagram of the oscillator circuit of FIG. 3.
Figure 5:
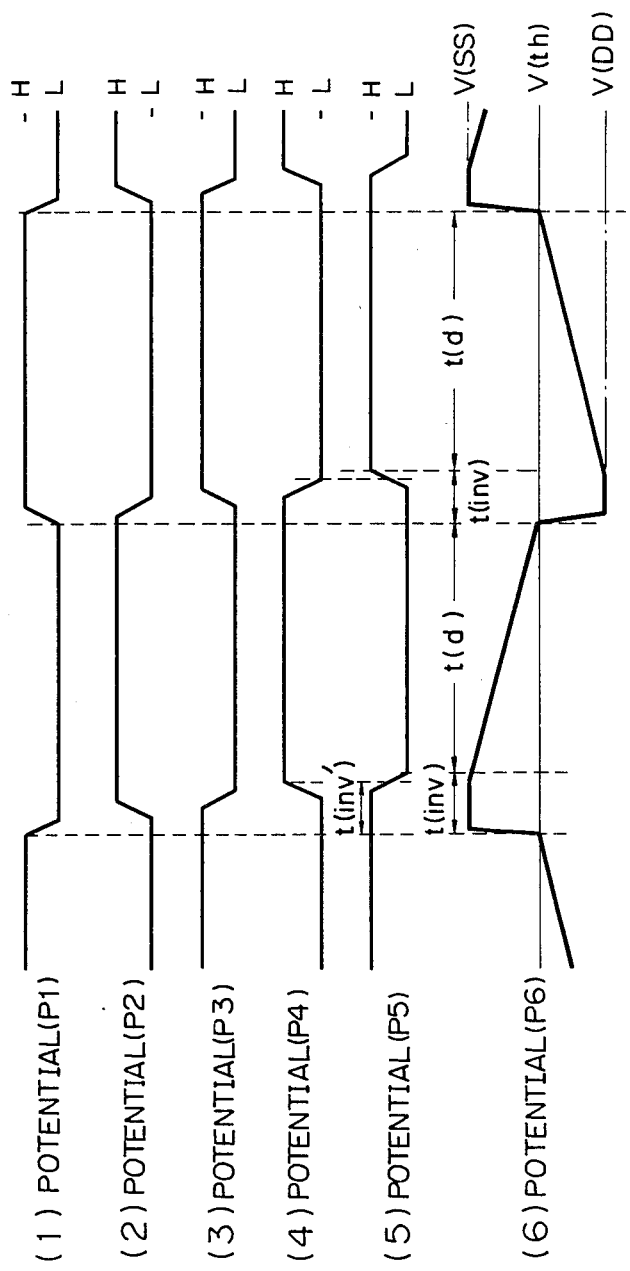
FIG. 5 is a waveform chart showing waveforms corresponding to points in FIG. 3 and FIG. 4.

A preferred embodiment of the present invention will now be explained with reference to FIGS. 3 to 5. FIG. 3 is a schematic representation of an oscillator circuit of an embodiment of the present invention. FIG. 4 illustrates the oscillator circuit of FIG. 3 in more detail.

The oscillator circuit of FIGS. 3 and 4 includes an odd number of CMOS type inverters 1 to 5 (five in the present embodiment) connected in cascade to form a loop, a delay circuit 6 inserted between the inverters 5 and 1, an output terminal 7, a pull-up circuit 8 including two P-channel MOS transistors 81 and 82 for pulling up the potential of the output terminal of the delay circuit 6, and a pull-down circuit 9 including two N-channel MOS transistors 91 and 92 for pulling down the potential of the output terminal thereof. The transistors 81 and 82 are connected in series between the output terminal of the delay circuit 6 (i.e., a point P6) and a source supply voltage $V_{(SS)}$. Also, the transistors 91 and 92 are connected in series between the output terminal of the delay circuit 6 and a drain supply voltage $V_{(DD)}$ (or ground). The gate electrodes of the transistors 81 and 91 are connected to the output terminal of the inverter 4 (i.e., a point 4). The gate electrodes of the transistors 82 and 92 are connected to the output terminal of the inverter 1 (i.e., point 1).

Each of the inverters 1 through 5 includes a P-channel MOS transistor $Q_p$ and N-channel MOS transistor $Q_n$ connected in series between the supply voltages $V_{(SS)}$ and $V_{(DD)}$. The delay circuit 6 is an integration circuit including a resistance element 61 and a capacitance element 62. As shown in FIG. 4, the resistance element 61 is constituted by a parallel connection of an N-channel MOS transistor $Q_n$ with a gate electrode connected to the supply voltage $V_{(SS)}$ and a P-channel MOS transistor $Q_p$ with a gate electrode connected to the supply voltage $V_{(DD)}$. The capacitance element 62 is constituted by a P-channel capacitor between a point P6 and the supply voltage $V_{(SS)}$ and an N-channel capacitor between the point P6 and the supply voltage $V_{(DD)}$.

The mode of operation of the above-described embodiment will now be described with reference to FIG. 5. In FIG. 5, (1) through (6) show the voltage waveforms at points P1 through P6 in FIGS. 3 and 4, respectively.

Now, assume that the output voltage of the inverter 4 is "L" level and that of the inverter 5 "H". The output voltage of the delay circuit 6 increases gradually but under the threshold voltage $V_{(th)}$ of the inverter 1. Therefore the output voltage of the inverter 1 is "H".

In this case, the transistor 81 is ON and the transistor 91 OFF due to the "L" level output voltage of the inverter 4, while the transistor 82 is OFF and the transistor 92 ON due to the "H" level output voltage of the inverter 1. Therefore the output terminal of the delay circuit 6 is neither pulled up nor pulled down and continues to increase gradually.

When the output voltage of the delay circuit 6 becomes higher than the threshold voltage $V_{(th)}$, the inverter 1 inverts and the output voltage thereof becomes "L", which makes the transistor 82 ON and the transistor 92 OFF. Therefore, the output terminal of the delay circuit 6 is pulled up rapidly to the supply voltage $V_{(SS)}$ through the transistors 81 and 82 being in the ON state. The inversion of the inverter 1 is immediately transmitted from the inverter 1 through the inverter 5 in sequence. Consequently, the output voltage of the inverter 4 changes from "L" to "H", which causes the transistor 81 to turn off so that the pull-up state of the output terminal of the delay circuit 6 is terminated. As a result, the pull-up time is a short time corresponding to the inversion time $t_{(inv)}'$ necessary for the transmission of the level change from the point 1 to the point 4 through points P2 and P3. However, if a high transconductance $g_m$ is selected for the transistors 81 and 82, the point 6 can be pulled up near the supply voltage $V_{(SS)}$ even if the inversion time $t_{(inv)}'$ is very short.

After pulling up the potential of the output terminal of the delay circuit 6 near to the supply voltage $V_{(SS)}$, the output voltage of the inverter 5 changes to "L", whereby the delay circuit 6 assumes the discharging mode where the output voltage thereof decreases gradually. In this discharging mode, the transistors 82 and 91 turn ON and the transistors 81 and 92 turn OFF due to the inversions of the inverters 1 through 5.

When the output voltage of the delay circuit 6 becomes lower than the threshold voltage $V_{(th)}$, the output voltage of the inverter 1 changes from "L" to "H" so that the transistor 92 turns ON and the transistor 82 turns OFF. As a result, the output terminal of the delay circuit 6 is pulled down through the transistors 91 and 92 being ON near to the supply voltage $V_{(DD)}$. The inversion of the inverter 1 is immediately transmitted from the inverter 1 through the inverter 6 in sequence, whereby the transistor 91 is turned OFF so as to terminate the pull-down state. Accordingly, the pull-down time is a short time corresponding to the inversion time $t_{(inv)}'$ from the inversion of the inverter 1 to that of the inverter 4. However, if a high transconductance $g_m$ is selected for the transistors 91 and 92, the point 6 can be pulled down near to the supply voltage $V_{(DD)}$ in that short time.

The oscillator circuit repeats the same operation described above, and the oscillation continues.

For the pull-up or pull-down of the output terminal of the delay circuit, it is enough to use only the transistors 82 and 92. However, if only the transistors 82 and 92 are used, the output terminal of the delay circuit is latched in the pull-up or pull-down state, therefore, oscillation does not occur. Accordingly, the transistors 81 and 91 are used for the purpose of the cancellation of the latched states, in other words, for the purpose of the determination of the pull-up or pull-down times. Additionally, the above described pull-up or pull-down times can be extended by inserting a delay circuit between the inverters 1 through 5.

Although a preferred embodiment has been described heretofore, various modifications and alterations are possible within the scope of the present invention.

For example, in the above-described example, five inverters cascaded in a loop circuit are used, however, the number of inverters is not always limited to five. Any odd number of inverters may be used. Further, it is not always necessary to use both the pull-up circuit and the pull-down circuit, i.e., it is enough to use one of them. Needless to say, using both circuits is most effective, since the output terminal of the delay circuit 6 can be fully pulled up and down to both supply voltages $V_{(SS)}$ and $V_{(DD)}$. Furthermore, the constitutions of the pull-up and pull-down circuits are not limited to the above-described example. Various types of circuits which can pull up or pull down for the predetermined period in response to the inversion operations of an inverter cascaded in a loop circuit may be used for this purpose.

Figure 6:
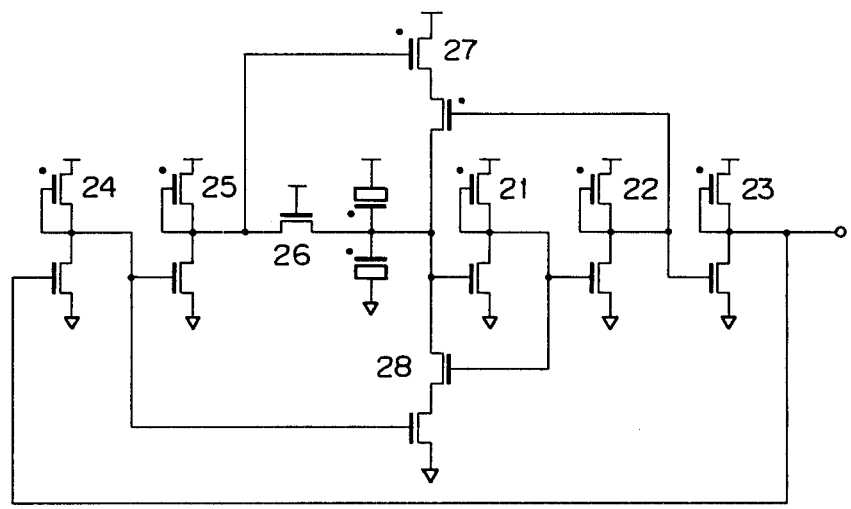
FIG. 6 is a circuit diagram of a modification of the oscillator circuit according to the present invention.

Furthermore, in the above-described embodiment, the oscillator circuit is constituted by MOS elements. However, N-channel metal oxide semiconductor elements (NMOS) are also available. FIG. 6 shows another embodiment of the oscillator circuit according to the present invention. In FIG. 6, 21 through 25 are inverters cascaded in a loop, 26 a delay circuit, 27 a pull-up circuit, and 28 a pull-down circuit.

The oscillator circuit of the present invention can be used for a generator for generating a bias voltage of a substrate used in a semiconductor memory device. In the semiconductor memory device, the potential of a chip (semiconductor substrate) is in general maintained at a negative potential.

Since external supply of this negative potential would entail addition of an input terminal to the memory device, this negative potential is in general generated by a substrate bias voltage generator provided in the memory device.

Figure 7:
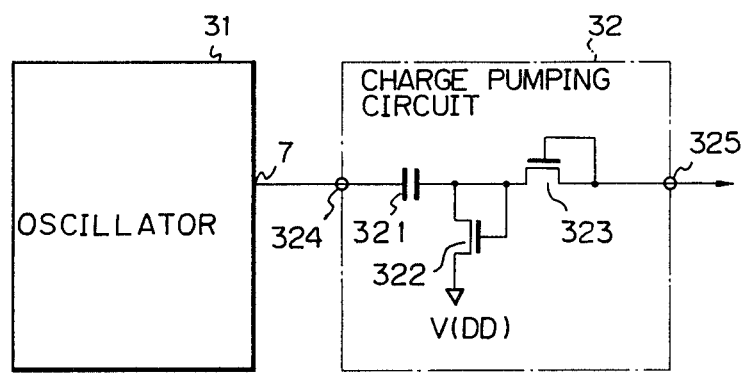
FIG. 7 illustrates the use of the oscillator circuit of the present invention.

FIG. 7 illustrates such a generator for generating a bias voltage of the substrate. In FIG. 7, 31 is an oscillator circuit according to the present invention and 32 a charge pumping circuit. The charge pumping circuit includes a capacitor 321 and two transistors 322 and 323, each of which transistor shorted between drain and gate electrodes so as to operate as a diode. An input terminal 324 of the charge pumping circuit is connected to the output terminal 7 of the oscillator circuit 31, and an output terminal 325 thereof is connected to the substrate of the memory device.

The mode of operation is as follows. When the output terminal 7 is "H" level, a current flows through the capacitor 321 and the transistor 322 to the drain supply voltage $V_{(DD)}$, whereby a terminal 324 side electrode of the capacitor 321 is charged to a positive voltage. When the output terminal 7 is "L" level, a current flows through the output terminal 325, the transistor 323, and the capacitor 321 in sequence. The above-described operation is repeated according to the "H" or "L" levels of the output terminal 7. As a result, the current (positive charge) is extracted from the substrate, whereby the substrate is electrified negatively.

I claim:

1. An oscillator circuit comprising:
   an odd number of inverters connected in cascade to form a loop;
   a delay element inserted between adjacent inverters; and
   a pulling circuit for pulling up the potential of the output terminal of said delay element during a predetermined period after the potential of said output terminal becomes higher than the threshold voltage of said inverter connected to the output terminal of said delay element and/or for pulling down the potential of said output terminal during a predetermined period after the potential of said output terminal becomes lower than said threshold voltage.

2. An oscillator circuit according to claim 1, wherein said delay element is an integration circuit consisting of a capacitance element and a resistance element.

3. An oscillator circuit according to claim 2, wherein said resistance element is constituted by an MOS type transistor and said capacitance element is constituted by an MOS capacitor.

4. An oscillator circuit according to claim 1, wherein said pulling circuit is constituted by transistors, said transistors being turned on or turned off in response to an inversion operation of one of said inverters.

5. An oscillator circuit according to claim 1, wherein each of said inverters, said delay element, and said pulling circuit is constituted by an MOS element.

6. An oscillator circuit according to claim 1, wherein each of said inverters, said delay element, and said pulling circuit is constituted by an NMOS element.

7. An oscillator circuit comprising:
   an odd number of inverters connected in cascade to form a loop;
   a delay element inserted between adjacent inverters in the loop; and
   a circuit for pulling up and pulling down the potential of the output terminal of the delay element alternately in response to the inversion operation of one of said inverters.

8. A substrate bias voltage generator comprising an oscillator circuit comprising: an odd number of inverters connected in cascade to form a loop; a delay element inserted between adjacent inverters; and a pulling circuit for pulling up the potential of the output terminal of said delay element during a predetermined period after the potential of said output terminal becomes higher than the threshold voltage of said inverter connected to the output terminal of said delay element and/or for pulling down the potential of said output terminal during a predetermined period after the potential of said output terminal becomes lower than said threshold voltage; and
   a charge pumping circuit for generating the substrate bias voltage connected to an output terminal of said oscillator circuit.

* * * * *